(12) United States Patent
Gu et al.

(10) Patent No.: US 9,599,678 B2
(45) Date of Patent: Mar. 21, 2017

(54) TESTING SYSTEM FOR BACKLIGHT SOURCE

(71) Applicants: BOE Technology Group Co., Ltd., Beijing (CN); BOE Optical Science and Technology Co., Ltd., Suzhou (CN)

(72) Inventors: Zhenghe Gu, Beijing (CN); Chunlei Cao, Beijing (CN)

(73) Assignees: BOE Technology Group Co., Ltd., Beijing (CN); BOE Optical Science and Technology Co., Ltd., Suzhou (CN)

( * ) Notice: Subject to any disclaimer, the term of this patent is extended or adjusted under 35 U.S.C. 154(b) by 239 days.

(21) Appl. No.: 14/496,278

(22) Filed: Sep. 25, 2014

(65) Prior Publication Data

US 2015/0362562 A1 Dec. 17, 2015

(30) Foreign Application Priority Data

Jun. 16, 2014 (CN) .......................... 2014 1 0267502

(51) Int. Cl.
*G01R 31/44* (2006.01)
*G09G 3/36* (2006.01)
(Continued)

(52) U.S. Cl.
CPC .............. *G01R 31/44* (2013.01); *G09G 3/006* (2013.01); *G09G 3/3406* (2013.01); *G09G 3/36* (2013.01);
(Continued)

(58) Field of Classification Search
CPC ................ G01R 31/44; G01R 31/2806; G01R 31/3161; G01R 3/00; G01D 11/24;
(Continued)

(56) References Cited

U.S. PATENT DOCUMENTS

2003/0128036 A1* 7/2003 Henningson ......... G01R 31/021
324/426
2008/0088260 A1* 4/2008 Hsu ....................... G09G 3/3406
315/294
(Continued)

FOREIGN PATENT DOCUMENTS

CN 1431747 A 7/2003
CN 201414240 Y 2/2010
(Continued)

OTHER PUBLICATIONS

First Office Action, including Search Report, for Chinese Patent Application No. 201410267502.0, dated Aug. 19, 2015, 9 pages.
(Continued)

*Primary Examiner* — Vincent Q Nguyen
(74) *Attorney, Agent, or Firm* — Westman, Champlin & Koehler, P.A.

(57) ABSTRACT

A testing circuit for backlight source is provided. The testing circuit includes: a power module; a first ON/OFF module; a second ON/OFF module, the power module, the first ON/OFF module and the second ON/OFF module being connected in series; a control module electrically connected to the first ON/OFF module and the second ON/OFF module respectively; and a parallel branch connected in parallel with the second ON/OFF module. The backlight source is connected in the parallel branch, and the control module is configured to control the first ON/OFF module to switched to an ON state from an OFF state when the control module receives a control signal, and to control the second ON/OFF module to be switched to an OFF state from an ON state after a predetermined time delay.

8 Claims, 2 Drawing Sheets

(51) Int. Cl.
*G09G 3/00* (2006.01)
*G09G 3/34* (2006.01)
*H05B 37/03* (2006.01)

(52) U.S. Cl.
CPC ..... *H05B 37/03* (2013.01); *G09G 2310/0237* (2013.01)

(58) Field of Classification Search
CPC .......... G01D 11/245; G01N 33/48778; G01N 33/48785; G01N 33/49; G01N 33/66; H05B 37/03
USPC ........................................ 324/760.01–763.01
See application file for complete search history.

(56) References Cited

U.S. PATENT DOCUMENTS

2010/0052558 A1* 3/2010 Lee ........................ G09G 3/342
                                                                    315/250
2014/0009161 A1* 1/2014 Liu ........................ G01R 31/44
                                                                    324/414
2014/0167770 A1* 6/2014 Gu ........................ G09G 3/006
                                                                    324/414

FOREIGN PATENT DOCUMENTS

| CN | 102354965 A | 2/2012 |
| CN | 102711306 A | 10/2012 |
| CN | 102762007 A | 10/2012 |
| CN | 103596335 A | 2/2014 |
| JP | 2013-191323 A | 9/2013 |

OTHER PUBLICATIONS

Second Office Action, including Search Report, for Chinese Patent Application No. 201410267502.0, dated Feb. 19, 2016, 9 pages.
Third Office Action, including Search Report, for Chinese Patent Application No. 201410267502.0, dated Aug. 10, 2016, 12 pages.

* cited by examiner

TESTING SYSTEM FOR BACKLIGHT SOURCE

CROSS-REVERENCE TO RELATED APPLICATION

This application claims the benefit of Chinese Patent Application No. 201410267502.0 filed on Jun. 16, 2014 in the State Intellectual Property Office of China, the whole disclosure of which is incorporated herein by reference.

BACKGROUND OF THE INVENTION

Field of the Invention

The present invention relates to the technical field of display, and especially to a system for testing backlight sources.

Description of the Related Art

Recently, liquid crystal display has been widely used in various electronic products, such as mobile phone, television, and the like. A backlight source is an important part of the liquid crystal display. Usually, optical performances of the backlight source need be tested by a testing system to make sure that the liquid crystal display could provide a uniform luminance.

Existing testing systems for the backlight source mainly operate in a constant current mode or a constant voltage mode, in which a 12 V/24 V/48 V voltage is transformed from a 220 V AC voltage by a transformer, and then is used to supply power to and to activate LED(s) in the backlight source through a constant current module or a constant voltage module. At the moment of activating a backlight source in existing testing systems, however, an inrush current is generated causing a current impact to the LED(s), and therefore service life of the LED(s) is adversely affected.

SUMMARY OF THE INVENTION

The present invention has been made to overcome or alleviate at least one aspect of the above mentioned disadvantages.

Accordingly, it is an object of the present invention to provide a testing system for a backlight source, which can increase service life of the LED(s) in the backlight source to be tested.

According to an aspect of the present invention, there is provided a testing system for a backlight source. The testing system comprises: a power module; a first ON/OFF module; a second ON/OFF module, wherein a circuit is formed by the power module, the first ON/OFF module, and the second ON/OFF module; and a control module electrically connected to the first ON/OFF module and the second ON/OFF module respectively. The second ON/OFF module is arranged to be electrically connected in parallel with the backlight source. The control module is configured such that when receiving a control signal, the control module controls the first ON/OFF module to switch to an ON state from an OFF state, and after a predetermined time delay, the control module controls the second ON/OFF module to switch to an OFF state from an ON state so as to connect the backlight source into the circuit.

With the testing system for testing the backlight source, when a control signal is sent by a user to the control module to start the testing, the control module sends control signals to the first ON/OFF module and the second ON/OFF module respectively. At first, the first ON/OFF module is switched to its ON state from its OFF state. At this time, the second ON/OFF module is in its ON state, such that the backlight source is shorted, and no current passes through the backlight source. After a predetermined time delay since the first ON/OFF module is switched to its ON state from its OFF state, the second ON/OFF module is switched from its ON state to its OFF state, such that the backlight source is connected into the circuit, and a preset voltage is formed between two terminals of the backlight source. In this way, no inrush current is generated at the time when the backlight source is activated, and service life of the LED(s) in the backlight source is increased.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
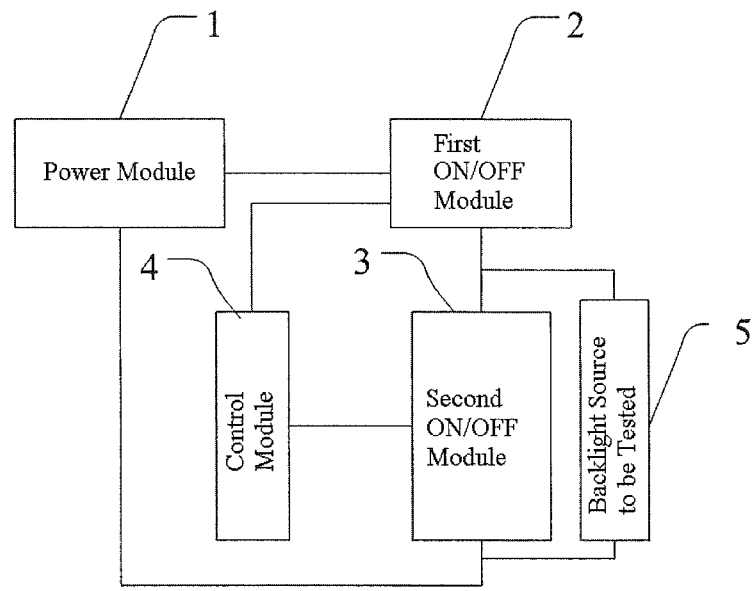
FIG. 1 is a schematic diagram showing a testing system for a backlight source according to a first embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

FIG. 1 is a schematic diagram showing a testing system for a backlight source according to a first embodiment of the present invention. The testing system comprises a power module 1, a first ON/OFF module 2, a second ON/OFF module 3, and a control module 4. The power module 1, the first ON/OFF module 2, and the second ON/OFF module 3 forms a circuit or loop, and the control module 4 is electrically connected to the first ON/OFF module 2 and the second ON/OFF module 3 respectively.

A backlight source 5 to be tested is arranged to be connected in parallel with the second ON/OFF module 2.

The first ON/OFF module 2 is a normally open module, which will be switched to an ON state upon receiving a control signal from the control module 4. The second ON/OFF module 3 is a normally closed module, which will be switched to an OFF state upon receiving a control signal from the control module 4. Since the second ON/OFF module 3 is normally closed, the backlight source 5 connected in parallel with the second ON/OFF module 3 is normally shorted.

When receiving a control signal input by a user, the control module 4 controls the first ON/OFF module 2 to switch to its ON state from its OFF state, and controls the second ON/OFF module 3 to switch to its OFF state from its ON state after a predetermined time delay since the first ON/OFF module 2 is switched to its ON state from its OFF state. As such, the shorted state of the backlight source 5 is removed, and a current passes through the backlight source 5 and therefore the backlight source 5 is connected into the circuit. The predetermined time delay may range from 0.05 seconds to 0.5 seconds, for example, may be 0.1 seconds, 0.2 seconds, 0.3 seconds, or the like.

In summary, in the testing system for backlight source according to the first embodiment of the present invention, when a control signal is sent by a user to the control module to start testing of a backlight source, the control module will send control signals to the first ON/OFF module and the second ON/OFF module respectively. At first, the control module controls the first ON/OFF module to switch to its ON state from its OFF state. At this time, the second ON/OFF module is still in its ON state, the backlight source connected in parallel with the second ON/OFF module is shorted, and no current flows through the backlight source. After a predetermined time delay, the second ON/OFF module 3 is switched to its OFF state from its ON state, and the backlight source is connected into the circuit. At this time, a predetermined voltage difference is applied to two ends of the backlight source. Therefore, no inrush current is generated at the moment the backlight source is activated, so that service life of the LED(s) in the backlight source is increased.

Figure 2:
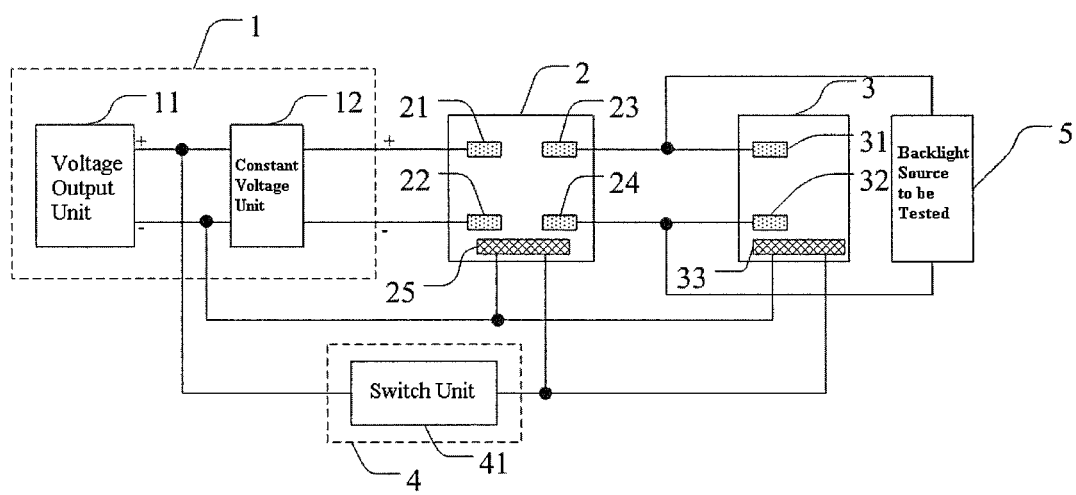
FIG. 2 is a schematic diagram showing a testing system for a backlight source according to a second embodiment of the present invention.

FIG. 2 is a schematic diagram showing a testing system for a backlight source according to a second embodiment of the present invention. Like the testing system in the first embodiment, the testing system in the second embodiment also comprises a power module 1, a first ON/OFF module 2, a second ON/OFF module 3, and a control module 4. The power module 1, the first ON/OFF module 2, and the second ON/OFF module 3 forms a circuit, and the control module 4 is electrically connected to the first ON/OFF module 2 and the second ON/OFF module 3 respectively.

A backlight source 5 to be tested is arranged to be connected in parallel with the second ON/OFF module 3.

Exemplarily, the power module 1 may comprise a voltage output unit 11 and a constant voltage unit 12 connected with the voltage output unit, wherein the voltage output unit 11 is used to convert, for example, a 220 V AC voltage into a DC voltage, and the constant voltage unit 12, which may be a constant voltage board, is used to convert the DC voltage outputted by the voltage output unit 11 into a desired constant voltage.

In the second embodiment, the first ON/OFF module 2 may consist of an electromagnetic relay, and the second ON/OFF module 3 may consist of a time delay relay.

Exemplarily, as shown in FIG. 2, the electromagnetic relay 2 may comprise a first contact 21, a second contact 22, a third contact 23 corresponding to the first contact 21, and a fourth contact 24 corresponding to the second contact 22. The first contact 21 is electrically connected to a positive electrode of the constant voltage unit 12, the second contact 22 is electrically connected to a negative electrode of the constant voltage unit 12, the third contact 23 is electrically connected to a first contact 31 of the time delay relay, and the fourth contact 24 is electrically connected to a second contact 32 of the time delay relay. The first contact 31 is electrically connected to one terminal of the backlight source 5, and the second contact 32 is electrically connected to the other terminal of the backlight source 5, so that the backlight source 5 is electrically connected in parallel with the second ON/OFF module.

In one example, the control module 4 may comprise a switch unit 41. One end of the switch unit 41 is electrically connected to a positive electrode of the voltage output unit 11, and the other end of the switch unit 41 is electrically connected to a control end of the electromagnetic relay and a control end of the time delay relay respectively. Exemplarily, the other end of the switch unit 41 may be electrically connected to a positive electrode of a control coil 25 of the electromagnetic relay and a positive electrode of a control coil 33 of the time delay relay, respectively. A negative electrode of the control coil 25 of the electromagnetic relay and a negative electrode of the control coil 33 of the time delay relay are electrically connected to a negative electrode of the voltage output unit 11.

In the testing system described in the second embodiment, the electromagnetic relay may be a normally open relay. That is to say, when no current passes through the control coil 25 of the electromagnetic relay 2, the connection between the first contact 21 and the third contact 23 and the connection between the second contact 22 and the fourth contact 24 are in an OFF state. When a current passes through the control coil 25, the connection between the first contact 21 and the third contact 23 and the connection between the second contact 22 and the fourth contact 24 are switched into an ON state. The time delay relay 3 is a normally closed relay. That is to say, when no current passes through the control coil 33 of the time delay relay 3, the connection between the first contact 31 and the second contact 32 is in an ON state. When a current is introduced through the control coil 33 by controlling the switch unit 41, the connection between the first contact 31 and the second contact 32 is switched into an OFF state.

Specifically, when a backlight source is to be tested, the switch unit 41 is closed, so that the control coils of the electromagnetic relay 2 and the time delay relay 3 are electrically connected to the voltage output unit 11. Therefore, in the electromagnetic relay 2, the first contact 21 is electrically connected to the third contact 23, and the second contact 22 is electrically connected to the fourth contact 24. At this time, in the time delay relay 3, the first contact 31 is still electrically connected with the second contact 32, so that a current circuit or loop is formed by the power module 1, the electromagnetic relay 2, and the time delay relay 3. At this time, the time delay relay is in the ON state, and its resistance is far smaller than that of the backlight source 5, such that the backlight source 5 is shorted. When the voltage in the circuit is relatively stable after a predetermined time delay, the connection between the first contact 31 and the second contact 32 of the time delay relay 3 is switched from an ON state to an OFF state, such that the backlight source 5 is connected into the circuit. At this time, a preset voltage is applied to two terminals of the backlight source 5, therefore no inrush current is generated at the time when the backlight source 5 is connected into the circuit, and service life of the LED(s) in the backlight source 5 is increased.

Figure 3:
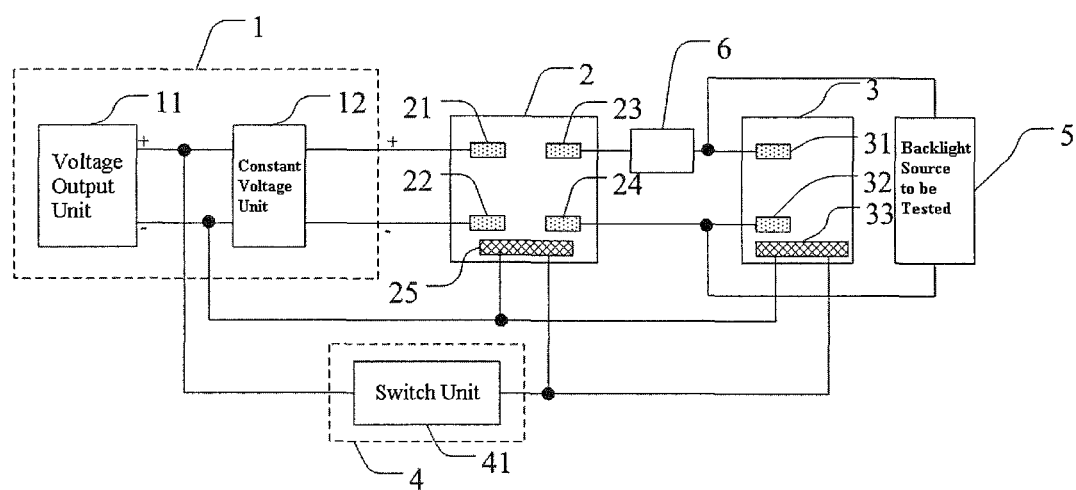
FIG. 3 is a schematic diagram showing a testing system for a backlight source according to a third embodiment of the present invention.

FIG. 3 is a schematic diagram showing a testing system for a backlight source according to a third embodiment of the present invention. The third embodiment is much similar to the second embodiment, except that the third embodiment comprises an additional protective resistor 6 disposed between the third contact 23 of the electromagnetic relay 2 and the first contact 31 of the time delay relay 3. The protective resistor 6 is provided for protecting the testing system or the backlight source 5 from being damaged by excessive current generated due to a small resistance of the entire circuit before connecting the backlight source 5 therein.

As described with reference to the first to the third embodiments of the present invention, the power module 1, the first ON/OFF module 2, and the second ON/OFF module 3 may sequentially form a circuit (as shown in FIG. 1). That is, the power module 1 is connected to both the first ON/OFF module 2 and the second ON/OFF module 3. However, the power module 1 may also be electrically connected to the second ON/OFF module 3 indirectly as described in the second and the third embodiments shown in FIGS. 2 and 3.

In an embodiment not shown, the electromagnetic relay 2 may comprise only two normally open contacts (for example, the first contact 21 and the third contact 23), the first contact 31 of the time delay relay 3 is electrically connected to the third contact 23 of the electromagnetic relay 2, and the second contact 32 of the time delay relay 3 is directly and electrically connected to the negative electrode of the constant voltage unit 12.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A testing circuit for a backlight source, comprising:
   a power module;
   a first ON/OFF module;
   a second ON/OFF module, the power module, the first ON/OFF module, and the second ON/OFF module being connected in series;
   a control module electrically connected to the first ON/OFF module and the second ON/OFF module; and
   a parallel branch connected in parallel with the second ON/OFF module,
   wherein the backlight source is connected in the parallel branch;
   wherein the control module is configured to control the first ON/OFF module to be switched to an ON state from an OFF state when the control module receives a control signal; and control the second ON/OFF module to be switched to an OFF state from an ON state after a predetermined time delay;
   wherein the power module comprises a voltage output unit and a constant voltage unit electrically connected with the voltage output unit;
   wherein the first ON/OFF module comprises an electromagnetic relay, and the second ON/OFF module comprises a time delay relay;
   wherein the electromagnetic relay comprises a first contact, a second contact, a third contact corresponding to the first contact, and a fourth contact corresponding to the second contact;
   wherein the first contact of the electromagnetic relay is electrically connected to a positive electrode of the constant voltage unit, the second contact of the electromagnetic relay is electrically connected to a negative electrode of the constant voltage unit, the third contact of the electromagnetic relay is electrically connected to a first contact of the time delay relay, and the fourth contact of the electromagnetic relay is electrically connected to a second contact of the time delay relay; and
   wherein the first contact of the time delay relay is electrically connected to one terminal of the backlight source, and the second contact of the time delay relay is electrically connected to the other terminal of the backlight source.

2. The testing circuit according to claim 1, wherein the control module comprises a switch unit; and
   wherein one end of the switch unit is electrically connected to the positive electrode of the voltage output unit, and the other end of the switch unit is electrically connected to a control end of the electromagnetic relay and a control end of the time delay relay.

3. The testing circuit according to claim 1, further comprising a protective resistor connected in series with the first ON/OFF module and the second ON/OFF module.

4. The testing circuit according to claim 1, wherein the predetermined time delay ranges from 0.05 seconds to 0.5 seconds.

5. A testing circuit for a backlight source, comprising:
   a power module;
   a first ON/OFF module;
   a second ON/OFF module, the power module, the first ON/OFF module, and the second ON/OFF module being connected in series;
   a control module electrically connected to the first ON/OFF module and the second ON/OFF module; and
   a parallel branch connected in parallel with the second ON/OFF module,
   wherein the backlight source is connected in the parallel branch;
   wherein the control module is configured to control the first ON/OFF module to be switched to an ON state from an OFF state when the control module receives a control signal; and control the second ON/OFF module to be switched to an OFF state from an ON state after a predetermined time delay;
   wherein the power module comprises a voltage output unit and a constant voltage unit electrically connected with the voltage output unit;
   wherein the first ON/OFF module comprises an electromagnetic relay, and the second ON/OFF module comprises a time delay relay;
   wherein the electromagnetic relay comprises a first contact, and a third contact corresponding to the first contact;
   wherein the first contact of the electromagnetic relay is electrically connected to a positive electrode of the constant voltage unit, and the third contact of the electromagnetic relay is electrically connected to a first contact of the time delay relay, and a second contact of the time delay relay is electrically connected to a negative electrode of the constant voltage unit; and
   wherein the first contact of the time delay relay is electrically connected to one terminal of the backlight source, and the second contact of the time delay relay is electrically connected to the other terminal of the backlight source.

6. The testing circuit according to claim 5, wherein the control module comprises a switch unit; and
   wherein one end of the switch unit is electrically connected to the positive electrode of the voltage output unit, and the other end of the switch unit is electrically connected to a control end of the electromagnetic relay and a control end of the time delay relay.

7. The testing circuit according to claim 5, further comprising a protective resistor connected in series with the first ON/OFF module and the second ON/OFF module.

8. The testing circuit according to claim 5, wherein the predetermined time delay ranges from 0.05 seconds to 0.5 seconds.

* * * * *